United States Patent
Oyamatsu

(10) Patent No.: US 10,007,483 B2
(45) Date of Patent: Jun. 26, 2018

(54) VOLUME ADJUSTMENT DEVICE

(71) Applicant: Onkyo Corporation, Osaka (JP)

(72) Inventor: Tsuyoshi Oyamatsu, Osaka (JP)

(73) Assignee: ONKYO CORPORATION, Osaka (JP)

( * ) Notice: Subject to any disclaimer, the term of this patent is extended or adjusted under 35 U.S.C. 154(b) by 0 days. days.

(21) Appl. No.: 15/463,054

(22) Filed: Mar. 20, 2017

(65) Prior Publication Data

US 2017/0277509 A1   Sep. 28, 2017

(30) Foreign Application Priority Data

Mar. 24, 2016   (JP) .................................. 2016-059493

(51) Int. Cl.
 *G06F 3/0484*  (2013.01)
 *G06F 3/0488*  (2013.01)
 *G06F 3/16*    (2006.01)
 *H03G 3/02*    (2006.01)

(52) U.S. Cl.
 CPC .......... *G06F 3/165* (2013.01); *G06F 3/04847* (2013.01); *H03G 3/02* (2013.01); *G06F 3/0488* (2013.01)

(58) Field of Classification Search
 CPC .... G06F 3/04847; G06F 3/0488; G06F 3/165; H03G 3/02
 See application file for complete search history.

(56) References Cited

U.S. PATENT DOCUMENTS

| | | | | |
|---|---|---|---|---|
| 5,491,782 | A | * | 2/1996 | King .................. G06F 3/04847 715/833 |
| 2008/0025529 | A1 | | 1/2008 | Keohane et al. |
| 2009/0015568 | A1 | * | 1/2009 | Koski ................ G06F 3/04855 345/184 |
| 2010/0005420 | A1 | * | 1/2010 | Schneider ........... G06F 3/04812 715/833 |

(Continued)

FOREIGN PATENT DOCUMENTS

| | | |
|---|---|---|
| JP | 3806610 B2 | 8/2006 |
| JP | 2008-048105 | 2/2008 |

(Continued)

OTHER PUBLICATIONS

Japanese Decision to Grant with translation for corresponding JP 2016-059493 dated Jul. 4, 2017.

*Primary Examiner* — Amy M Levy
(74) *Attorney, Agent, or Firm* — Renner, Otto, Boisselle & Sklar, LLP

(57) ABSTRACT

A volume adjustment device includes a display section, touch panel, and a controller which displays a slide bar including a knob, receives a movement goal position of the knob, adjusts volume of an audio signal to volume value corresponding to a position of the knob, moves the knob with a moving speed of the target of which the movement is received within a normal area in case that it receives movement of the target into a limit area in which the knob cannot move to not less than lower limit over the normal area in which the knob can move freely, and moves the knob and the lower limit of the limit area from the lower limit of the limit area to the target with the same predetermined speed as expansion speed of the limit area while it expands the normal area toward the limit area side.

12 Claims, 13 Drawing Sheets

(56) References Cited

U.S. PATENT DOCUMENTS

| | | |
|---|---|---|
| 2011/0130200 A1 | 6/2011 | Terada et al. |
| 2011/0242361 A1* | 10/2011 | Kuwahara ............... A63F 13/10 |
| | | 348/231.4 |
| 2012/0057725 A1* | 3/2012 | Nakamura ............. H04H 60/04 |
| | | 381/104 |
| 2012/0110452 A1* | 5/2012 | Hiipakka ............ G06F 3/04847 |
| | | 715/716 |
| 2013/0141364 A1 | 6/2013 | Lynn et al. |
| 2015/0193109 A1* | 7/2015 | Takahashi ........... G06F 3/04855 |
| | | 715/833 |
| 2016/0161960 A1* | 6/2016 | Yamada .............. G06F 3/04847 |
| | | 700/277 |

FOREIGN PATENT DOCUMENTS

| | | |
|---|---|---|
| JP | 2010036620 A | 2/2010 |
| JP | 2016019116 A | 2/2016 |

\* cited by examiner

-PRIOR ART-

-PRIOR ART-

VOLUME ADJUSTMENT DEVICE

BACKGROUND OF THE INVENTION

1. Field of the Invention

The present invention relates to a volume adjustment device for adjusting volume of an audio signal.

2. Description of the Related Art

There is a volume adjustment program that makes a smartphone, a tablet PC or the like function as a volume adjustment device for adjusting volume of an audio signal. For example, the volume adjustment program is integrated into a control program for operating an AV receiver from the smartphone. The smartphone into which the control program is installed communicates with the AV receiver wirelessly and controls the AV receiver. For example, the smartphone displays a slide bar at a display section to adjust volume of the audio signal that is output from the AV receiver to a speaker.

FIG. 12 illustrates an example that a conventional slide bar is displayed at the display section. The smartphone receives movement of a knob 100 by a touch panel interlocked with the display section. Position of the knob indicates volume value. The smartphone sends volume value corresponding to operation of the knob to the AV receiver. In this conventional example, in case that the user operates the knob by mistake, volume of the audio that is output from the AV receiver changes immediately. For this reason, there is possibility that loud audio that the user does not intend occurs.

In order to solve a problem above, in a device that is described in JP 3806610 B, as illustrated in FIG. 13, two knobs 101 and 102 are displayed at a display section. One knob 101 is a knob that a user can operate. The other knob 102 is a knob that indicates volume value. When the user operates the knob 101, the knob 101 moves according to the user's operation. The knob 102 follows the knob 101 that moves according to the user's operation with predetermined speed. After the user operates the knob 101, the user keeps touching the knob 101. When the knob 102 arrives at position of the knob 101, volume becomes volume that the user requests. After the user's operation of the knob 101, before the knob 102 arrives at position of the knob 101, the user leaves a finger from the knob 101. The knob 101 returns to the knob 102 that indicates volume value. Thus, even if the user moves the knob 101 widely by mistake, that loud audio output immediately is prevented.

In the device that is described in JP 3806610 B, there is a problem that the device cannot manage cases where the user would like to change volume quickly because increasing speed of the audio is always slow.

SUMMARY OF THE INVENTION

An objective of the present invention is that a user can change volume quickly and to prevent that loud audio that the user does not intend occurs.

A volume adjustment device comprising: a display section; a touch panel that is linked with the display section; and a controller, wherein the controller displays a slide bar including a knob indicating volume value on the display section, receives movement of a target that is a movement goal position of the knob, adjusts volume of an audio signal to volume value corresponding to a position of the knob, moves the knob with a moving speed of the target of which the movement is received within a normal area in case that it receives movement of the target into a limit area in which the knob cannot move to not less than lower limit over the normal area in which the knob can move freely, and moves the knob and the lower limit of the limit area from the lower limit of the limit area to the target with the same predetermined speed as expansion speed of the limit area while it expands the normal area toward the limit area side with the predetermined speed.

In the present invention, in case that a controller receives movement of a target that is a movement goal position of a knob into a limit area over a normal area, it moves the knob with moving speed of the target that movement thereof is received within the normal area. Thus, a user can change volume quickly within the normal area. Further, the controller moves the knob and lower limit of the limit area from the lower limit of the limit area to the target with the same predetermined speed as expansion speed of the limit area while it expands the normal area toward the limit area side with the predetermined speed. Thus, that loud audio that the user does not intend occurs is prevented.

Preferably, wherein the predetermined speed is slower than movement speed of the target that the controller receives movement.

Further, in the present invention, the controller moves the knob from the lower limit of the limit area to the target with the predetermined speed that is slower than movement speed of the target of which the movement is received. Thus, that loud audio that the user does not intend occurs is prevented because change of volume value becomes slow.

Preferably, wherein the controller expands the normal area toward the limit area side to a predetermined area after it moves the knob to the target.

In the present invention, after the controller moves the knob to the target, it expands the normal area toward the limit area side to the predetermined area. Thus, the user can move the knob toward the limit area side to the predetermined area quickly.

Preferably, wherein the controller detects contact to the knob by the touch panel, receives movement of detected contact as movement of the target, and moves the knob with the predetermined speed to the target while it expands the normal area toward the limit area side to the target with the predetermined speed in case that it receives movement of the target into the limit area over the normal area and if it continues detecting contact of the target.

In the present invention, in case that the controller receives movement of the target into the limit area over the normal area if it continues detecting contact of the target, it moves the knob and the lower limit of the limit area with the predetermined speed to the target while it expands the normal area toward the limit area side with the predetermined speed. Thus, after the user moves the target to the limit area, if it contacts the touch panel until the knob arrives at the target, it can move the knob to the target and direct desired volume value.

Preferably, wherein the controller stops expansion of the normal area and movement of the knob when it does not detect contact to the target before it moves the knob to the target in case that the controller receives the movement of the target to the limit area over the normal area.

In the present invention, in case that the controller receives movement of the target to the limit area over the normal area, when it does not detect contact to the target before it moves the knob to the target, it stops expansion of the normal area and movement of the knob. Thus, in case that the user directs loud volume value unintentionally, volume value can be suppressed by releasing a finger from the touch panel.

Preferably, wherein the controller stops expansion of the normal area and moves the knob to the target within the normal area after it receives movement of the target to the limit area over the normal area in case that it receives movement of the target from the limit area to the normal area.

Preferably, wherein the controller expands the normal area toward the limit area side to the predetermined area in case that distance between a position of the knob within the normal area and lower limit of the stopped limit area is less than distance corresponding to the predetermined area.

Preferably, wherein the controller expands the limit area toward normal area side in case that distance between a position of the knob within the normal area and lower limit of the limit area is not less than distance corresponding to the predetermined area after the predetermined time passes after movement of the knob.

In the present invention, in case that distance between the position of the knob within the normal area and the lower limit of the limit area is not less than distance corresponding to the predetermined area after the predetermined time passes after movement of the knob, the controller expands the limit area toward the normal area. Thus, that loud audio that the user does not intend occurs with not less than current volume is prevented.

Preferably, wherein the controller expands the limit area toward the normal area side so that distance between the position of the knob and the lower limit of the limit area can be distance corresponding to the predetermined area.

In the present invention, the controller expands the limit area toward the normal area side so that distance between the position of the knob and the lower limit of the limit area can be distance corresponding to the predetermined area. The user can move the knob toward the limit area side to the predetermined area from current volume quickly.

Preferably, wherein the controller receives setting of limit value of the lower limit of the limit area, and does not drop the lower limit of the limit area less than limit value that it receives.

In the present invention, the controller receives setting of limit value of the lower limit of the limit area, and it does not drop the lower limit of the limit area less than limit value that it receives. Thus, the user can move the knob quickly within the region that is less than limit value.

Preferably, further comprising: a communication section that is for communicating with an external device, wherein the controller adjusts volume of the audio signal that is output from the external device by sending volume value corresponding to position of the moved knob to the external device.

In the present invention, the controller adjusts volume of the audio signal that is output from an external device by sending volume value corresponding to position of the moved knob to an external device. Thus, the user can direct volume value of the audio signal that is output from the external device by a volume adjustment device.

A storage medium in which a volume a volume adjustment program is stored, the volume adjustment program allows a processor of a computer including a display section, a touch panel that is linked with the display section, and the controller to display a slide bar including a knob indicating volume value on the display section, to receive movement of a target that is a movement goal position of the knob, to adjust volume of an audio signal to volume value corresponding to a position of the knob, to move the knob with a moving speed of the target of which the movement is received within a normal area in case that it receives movement of the target into a limit area in which the knob cannot move to not less than lower limit over the normal area in which the knob can move freely, and to move the knob and the lower limit of the limit area from the lower limit of the limit area to the target with the same predetermined speed as expansion speed of the limit area while it expands the normal area toward the limit area side with the predetermined speed.

According to the present invention, a user can change volume quickly. Further, that loud audio that the user does not intend occurs is prevented.

DETAILED DESCRIPTION OF THE PREFERRED EMBODIMENTS

Figure 1:
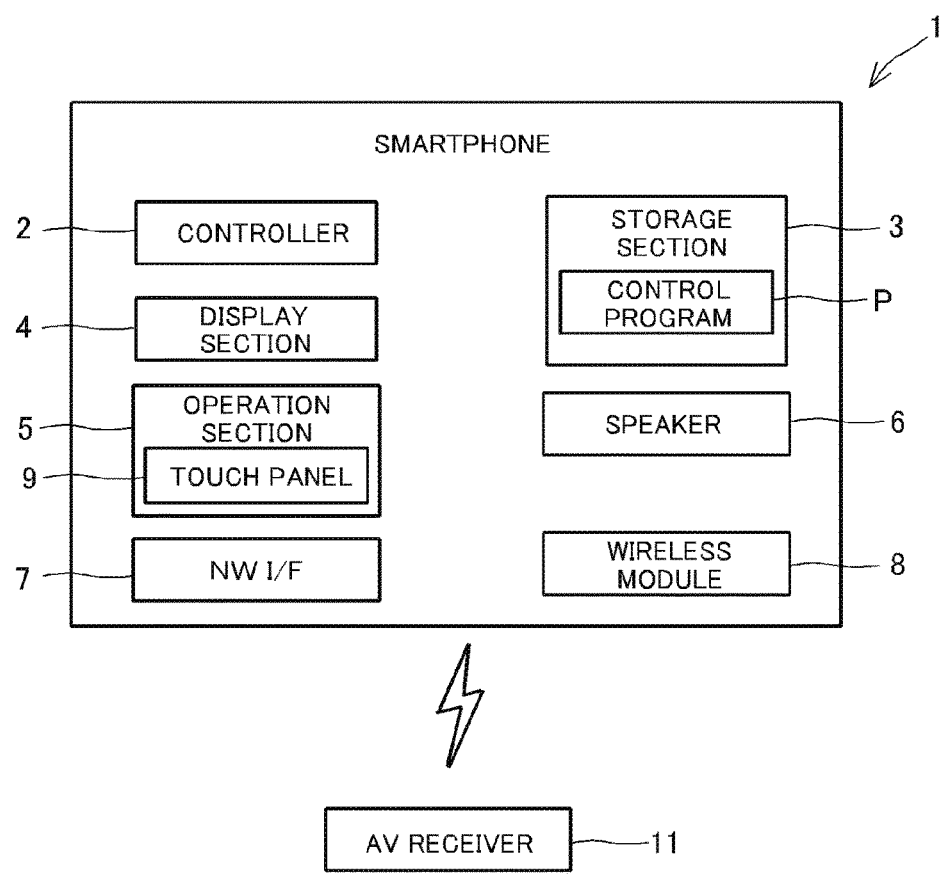
FIG. 1 is a block diagram illustrating a configuration of a smartphone according to an embodiment of the present invention.

An embodiment of the present invention is described below. FIG. 1 is a block diagram illustrating a configuration of a smartphone according to an embodiment of the present invention. The smartphone 1 (volume adjustment device) controls an AV receiver 11 (external device) by executing a control program P (volume adjustment program) that is stored in a storage section 3.

The smartphone 1 comprises a controller 2, the storage section 3, a display section 4, an operation section 5, a speaker 6, a network interface (hereinafter, referred as to "NW I/F") 7, and a wireless module 8.

The controller 2 controls respective sections composing the smartphone 1 according to a control program, an OS program, and application programs including the control program P. Further, the controller 2 controls the AV receiver 11 according to the control program P. Processing that the controller 2 performs according to the control program P is described later.

The storage section 3 is composed of a RAM (Random Access Memory) that functions as a main memory of the controller 2, a ROM (Read Only Memory) for storing the control program, and a flash memory for storing programs such as the OS program and the application programs including the control program P and various data such as a digital audio data. The storage section 3 is not limited to the illustrated constitution, and may include an HDD (Hard Disk Drive). The control program P may be stored in the storage section 3 at factory shipment, or may be downloaded from a server, not shown, via the NW I/F 7, described later, and stored in the storage section 3.

The display section 4 displays various images (including still images and moving images), and is composed of a liquid crystal panel. The operation section 5 comprises operation keys for performing various settings and a touch panel 9 that is linked with the display section 4. A user can input various characters such as telephone numbers and mail addresses and set communication setting via the operation section 5. The speaker 6 outputs various audio such as music based on audio data that is output from the controller 2. The NW I/F 7 can be connected to the Internet via a mobile phone network and a mobile phone base station, not shown. The smartphone 1 can telephone and communicate with another terminal via the NW I/F 7.

The wireless module 8 (communication section) is for performing wireless communication according to Bluetooth (registered trademark) standard and Wi-Fi standard. The smartphone 2 can perform wireless communication with an AV receiver 11 via the wireless module 8.

Figure 2:
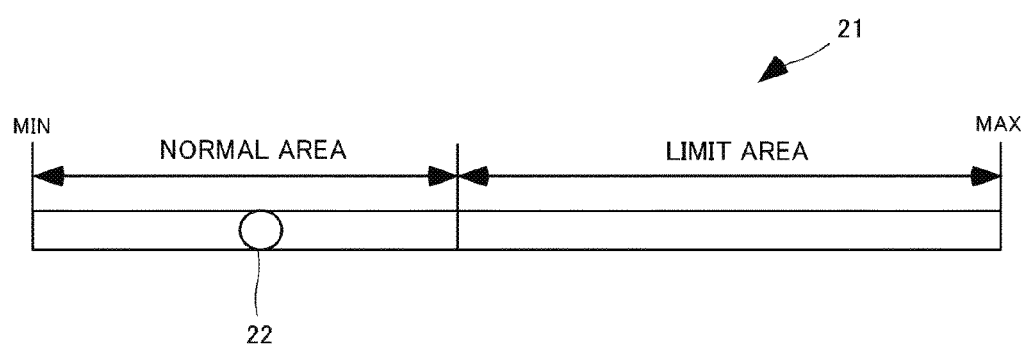
FIG. 2 is a diagram illustrating a slide bar.

Operation that the controller 2 performs according to the control program P is described below. As illustrated in FIG. 2, the controller 2 displays a slide bar 21 including a knob 22 indicating volume value at the display section 4. A reproduction screen other than the slide bar 21 is displayed at the display section 4 and the slide bar 21 is only described herein. In the slide bar 21, left edge is minimum value of volume. Right edge is maximum value of volume. The user can direct desired volume value to the smartphone 1 by putting a finger on the knob 22 and moving the knob 22 to left and right. The controller 2 receives movement of a target 23 (see FIG. 3) that is a movement goal position of the knob 22 by a touch panel 9. Concretely, the controller 2 detects contact to the knob 22 by the touch panel 9. The controller 2 receives movement of detected contact as movement of the target 23. In figures, the target 23 is illustrated, but the target 23 is not displayed at the display section 4.

The controller 2 adjusts volume of an audio signal to volume value corresponding to position of the knob 22. Concretely, the controller 2 adjusts volume of the audio signal that is output from the AV receiver 11 by sending volume value corresponding to position of the moved knob 22 to the AV receiver 11.

Figure 3:
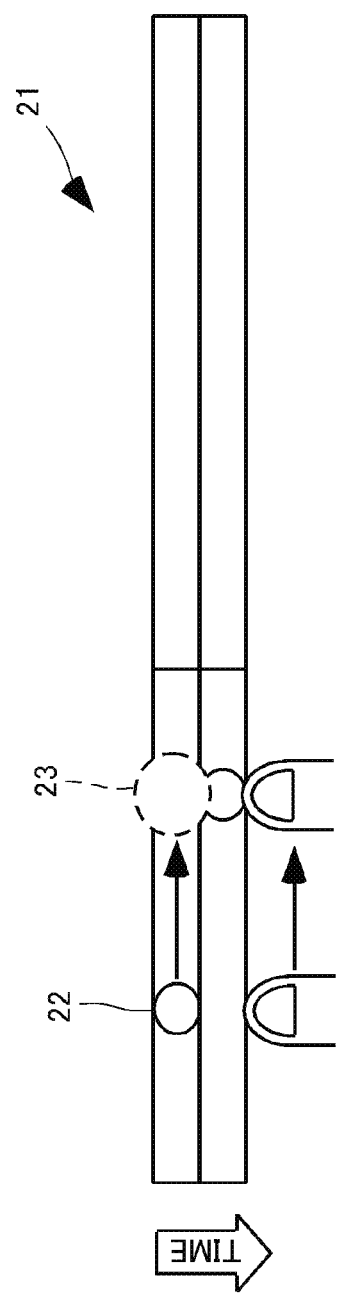
FIG. 3 is a diagram illustrating operation of the slide bar.

The slide bar 21 includes a normal area and a limit area. Left side is the normal area. Right side is the limit area. The normal area is an area that the knob 22 can move freely. Further, the normal area is an area that the knob 22 moves with the same speed as receiving speed of movement of the target 23. In other words, the normal area is an area that the knob 22 moves with movement speed of the finer of the user. For example, as illustrated in FIG. 3, in case that the controller 2 receives movement of the target 23 within the normal area, it moves the knob 22 to the target 23 (position that is illustrated by a circle that is illustrated by a broken line) that is the movement goal position of the knob 22 with movement speed of the target 23 that it receives movement. In other words, the controller 2 moves the knob 22 with movement speed of the finger of the user. In FIGS. 3 to 9, a part of reference numbers is omitted for ease of figures.

The limit area is an area that the knob 22 cannot move to not less than lower limit. Namely, the knob 22 does not move to not less than lower limit of the limit area (upper limit of the normal area).

Figure 4:
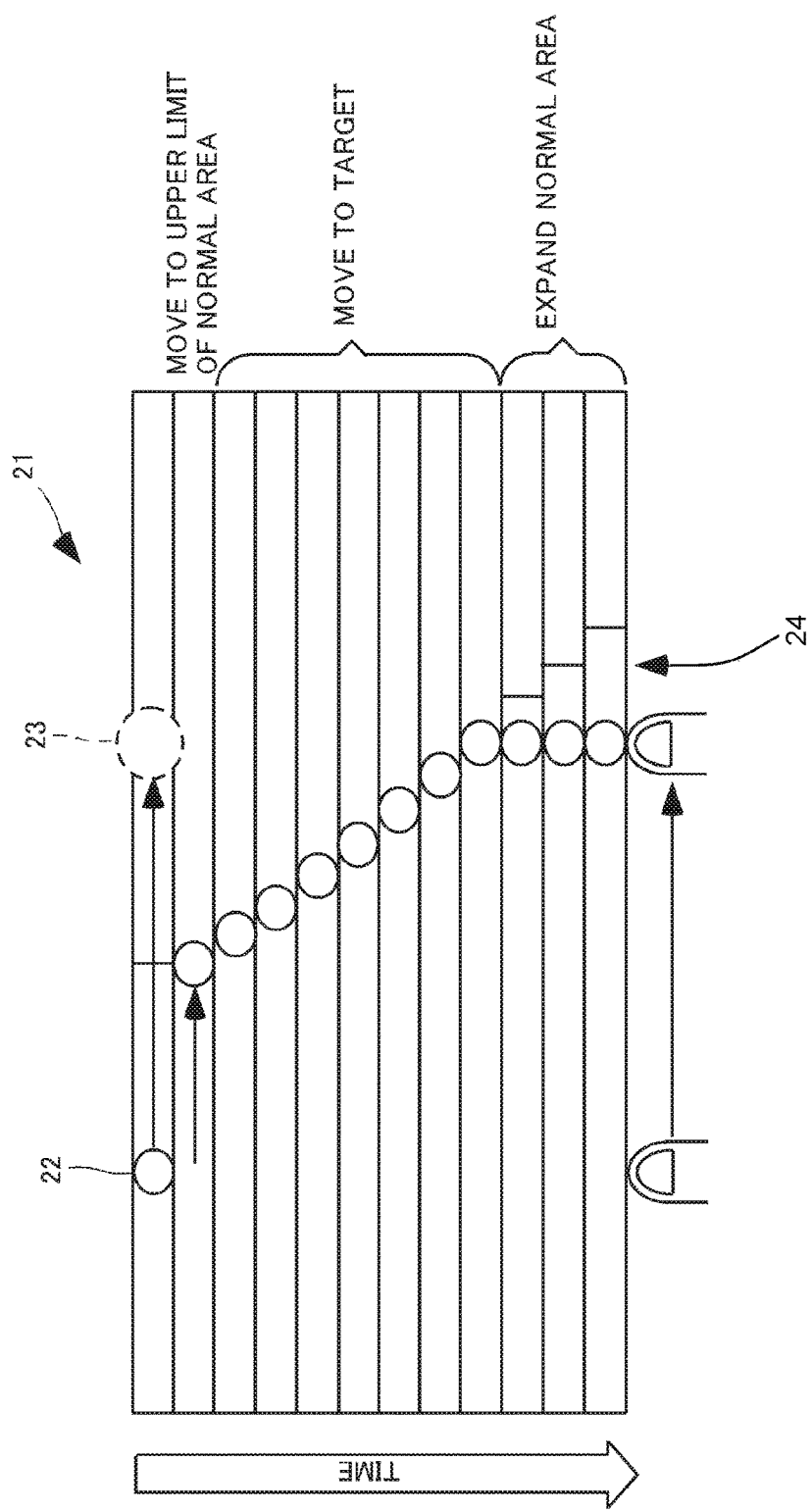
FIG. 4 is a diagram illustrating operation of the slide bar.

As illustrated in FIG. 4, the case where the controller 2 receives movement of the target 23 to the limit area over the normal area is described. It is assumed that the target 23 is moved to position that is illustrated by a circle of broken line illustrated in FIG. 4. In this case, the controller 2 receives movement of the target 23 to the limit area over the normal area. In the normal area, the controller 2 moves the knob 22 with movement speed of the target 23 that it receives movement. In other words, the controller 2 moves the knob 22 with movement speed of the finger of the user.

The controller 2 moves the knob 22 and the lower limit of the limit area from the lower limit of the limit area (the upper limit of the normal area) to the target 23 (the position illustrated by the circle of broken line) that is the movement goal position of the knob 22 with the same predetermined speed as expansion speed of the limit area while it expands the normal area toward the limit area side with the predetermined speed. Namely, the controller 2 moves the knob 22 with the predetermined speed while it affixes the knob 22 to the lower limit of the limit area. Therefore, the knob 22 moves to the normal area side with the lower limit of the limit area and does not exceed the lower limit of the limit area. Further, the controller 2 moves the knob 22 with the predetermined speed that is slower than movement speed of the target 23 that it receives movement. Namely, when the knob 22 exceeds the normal area, it leaves the finger of the user and moves, and the knob 22 and the target 23 exist indifferent positions.

After the controller 2 moves the knob 22 to the target 23, it expands the normal area toward the limit area side to the predetermined area 24. In other words, the controller 2 moves the lower limit of the limit area toward the upper limit of the limit area. Thus, the user can move the knob 22 quickly toward the limit area to the predetermined area 24.

Herein, in case that the controller 2 receives movement of the target 23 to the limit area over the normal area, if it continues detecting contact of the target 23, namely, the finger is contacted to the target 23 (the touch panel 9), it moves the knob 22 and the lower limit of the limit area to the target 23 with the predetermined speed while it expands the normal area toward the limit area side with the predetermined speed. After the user moves the target 23 to the limit area, it touches the touch panel 9 until the knob 22 arrives at the target 23 (a position of the finger), it can move the knob 22 to the target 23 and direct desired volume value.

Figure 5:
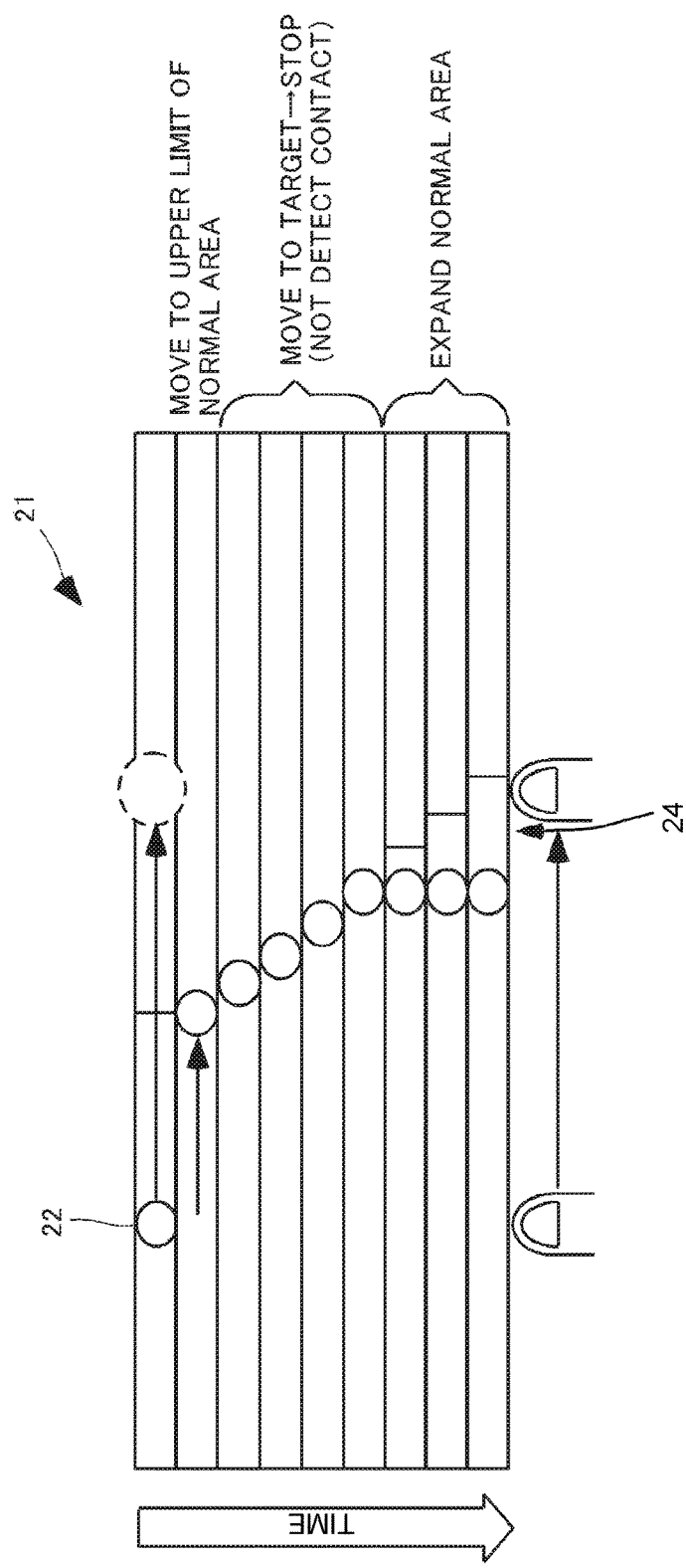
FIG. 5 is a diagram illustrating operation of the slide bar.

Meanwhile, in case that the controller 2 receives movement of the target 23 to the limit area over the normal area, when it does not detect contact to the target 23 before it moves the knob 22 to the target 23, namely, the finger is released from the target 23 (the touch panel 9), as illustrated in FIG. 5, it stops expansion of the limit area and movement of the knob 22. And, the controller 2 expands the normal area toward the limit area side to the predetermined area 24. For example, in case that the user directs loud volume value unintentionally, it releases the finger from the touch panel 9 so as to suppress volume value.

Figure 6:
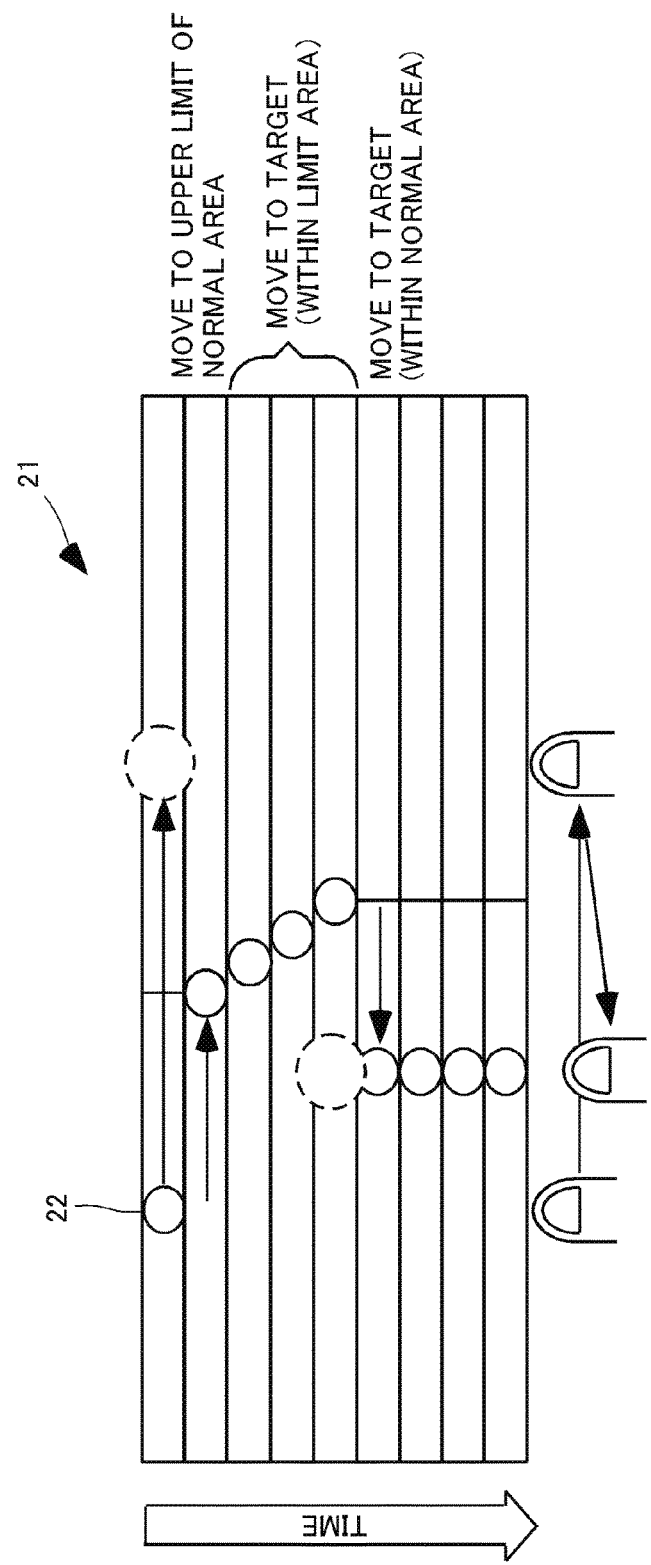
FIG. 6 is a diagram illustrating operation of the slide bar.

The case where the user moves the target 23 from the limit area to the normal area toward a direction that volume value decreases after it moves target 23 to the limit area over the normal area is described. As illustrated in FIG. 6, in case that the controller 2 receives movement of the target 23 from the limit area to the normal area after it receives movement of the target 23 to the limit area over the normal area, it stops expansion of the limit area. Further, the controller 2 moves the knob 22 to the target 23 within the normal area.

Figure 7:
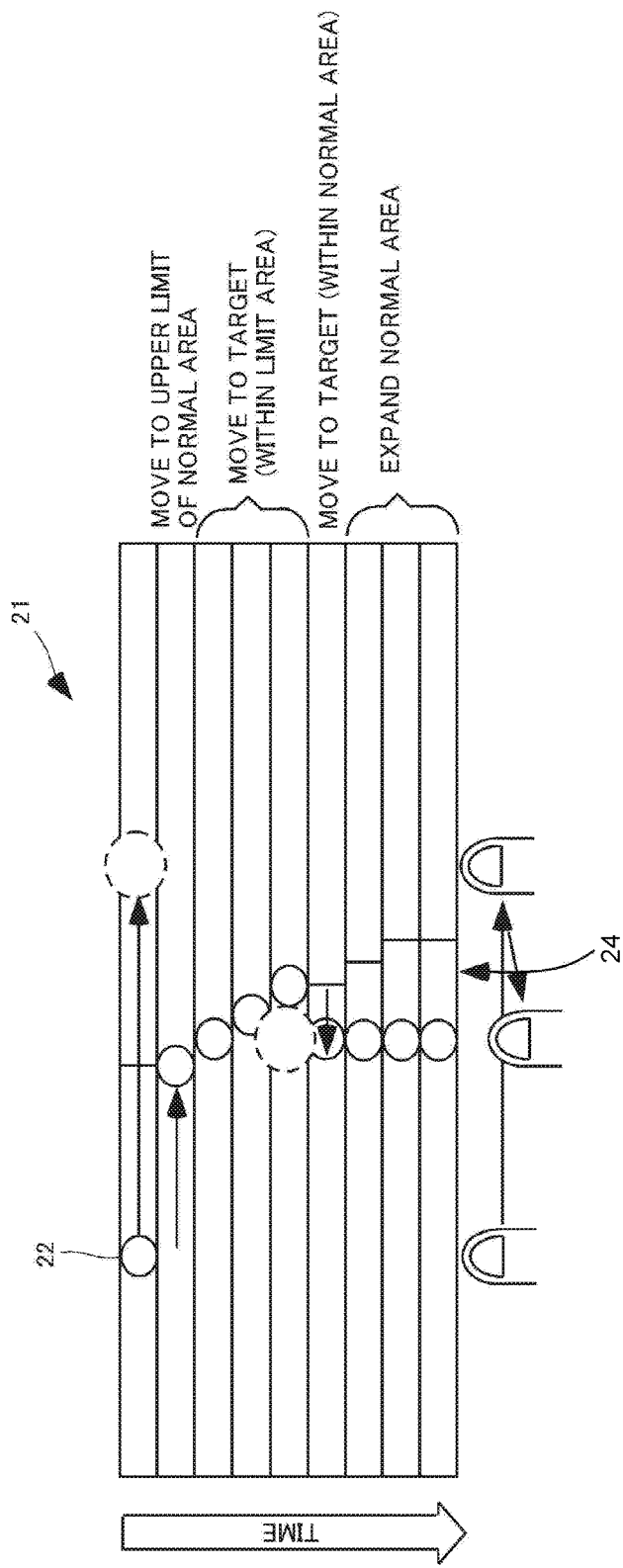
FIG. 7 is a diagram illustrating operation of the slide bar.

Herein, as illustrated in FIG. 7, in case that distance between a position of the knob 22 within the normal area and the stopped lower limit of the limit area is less than distance corresponding to the predetermined area 24, the controller 2 expands the normal area toward the limit area to the predetermined area 24. Thus, the user can move the knob 22 toward the limit area side to the predetermined area 24 quickly.

Figure 8:
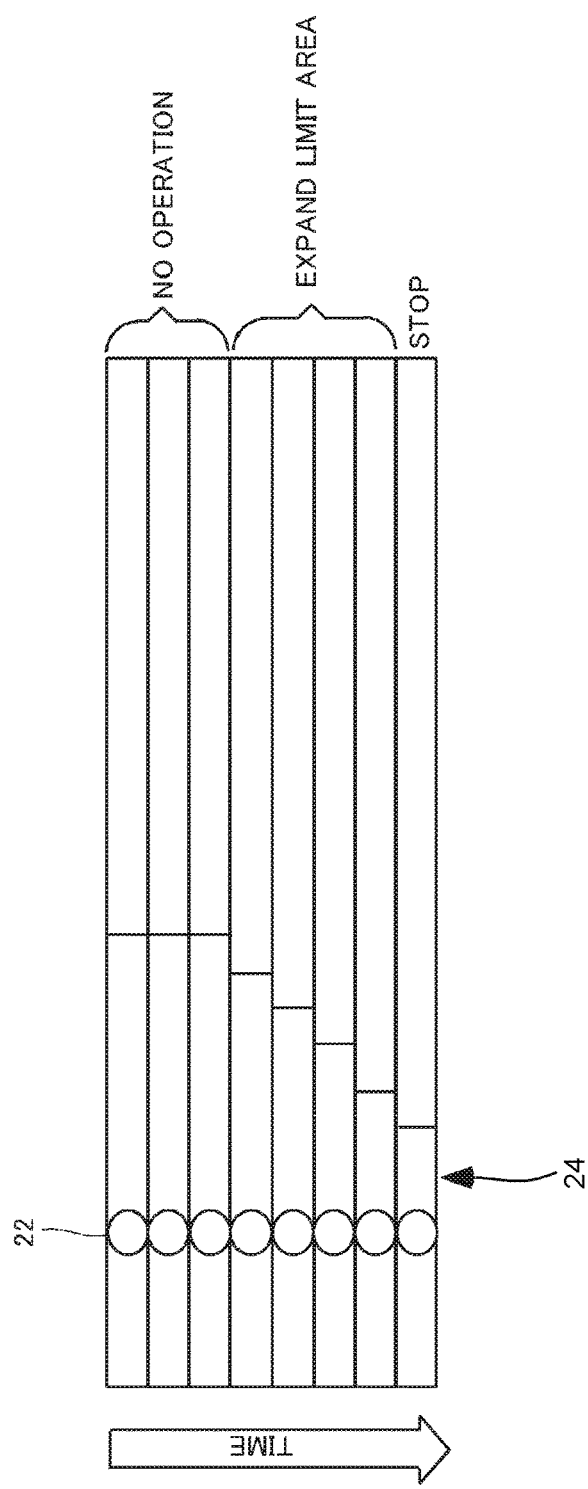
FIG. 8 is a diagram illustrating operation of the slide bar.

Further, as illustrated in FIG. 8, in case that distance between the position of the knob 22 within the normal area and the stopped lower limit of the limit area is not less than distance corresponding to the predetermined area 24 after the predetermined time passes after movement of the knob 22, the controller 2 expands the limit area toward the normal area. Concretely, the controller 2 expands the limit area toward the normal area side so that distance between the position of the knob 22 and the lower limit of the limit area can be distance corresponding to the predetermined area 24.

Figure 9:
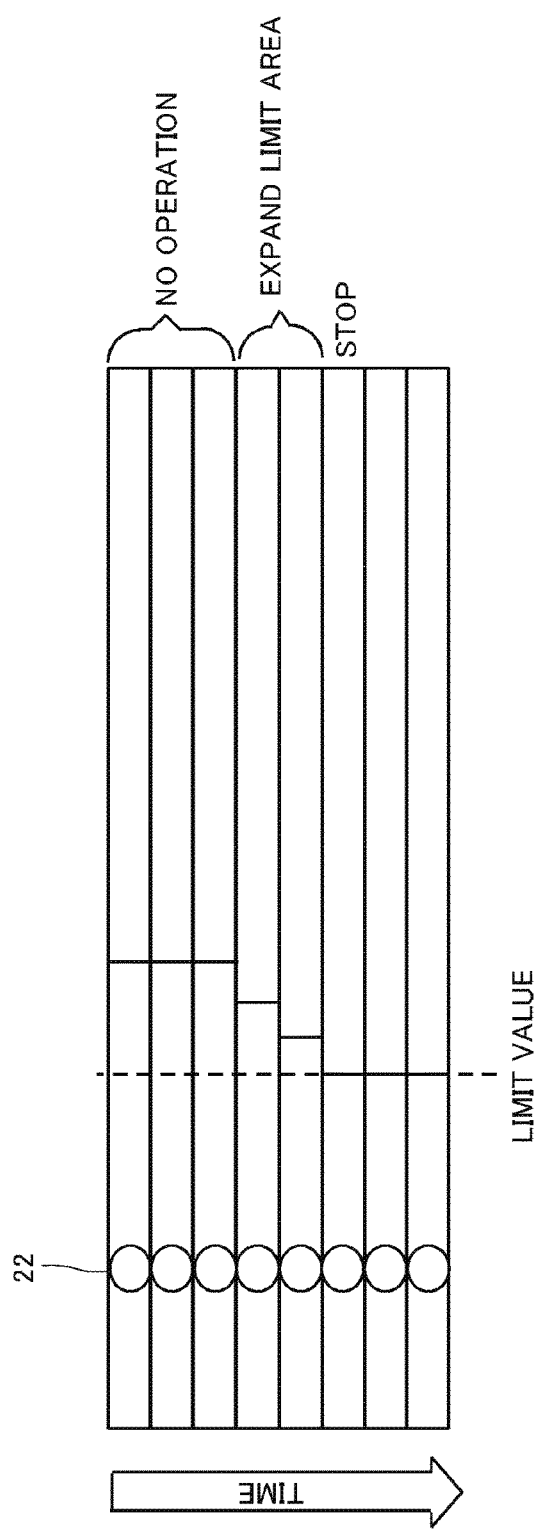
FIG. 9 is a diagram illustrating operation of the slide bar.

Further, the controller 2 receives setting of limit value of the lower limit of the limit area. And, as illustrated in FIG. 9, the controller 2 does not drop the lower limit of the limit area less than limit value that it receives.

Figure 10:
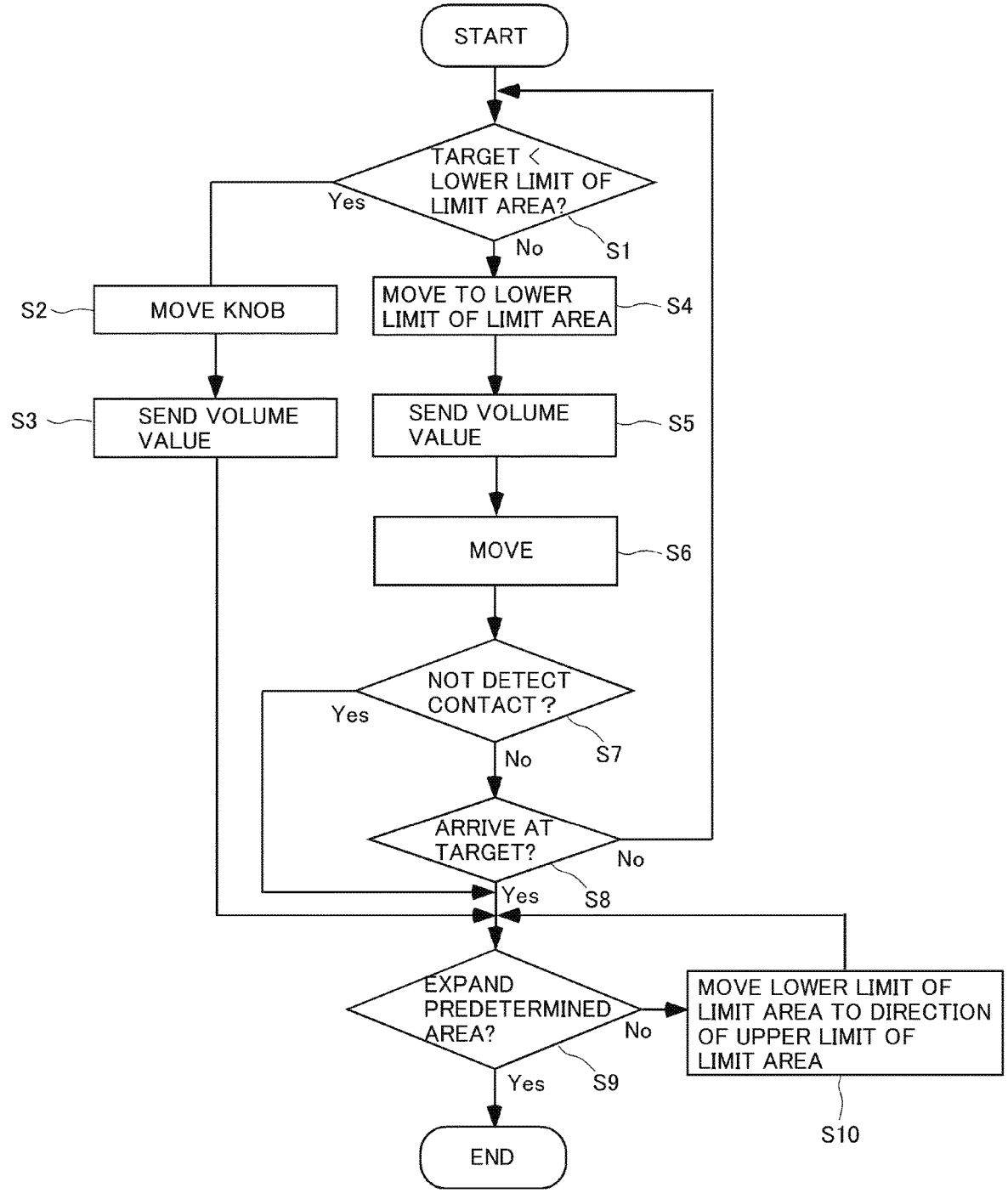
FIG. 10 is a flow chart illustrating processing operation of the smartphone in case where volume value is adjusted.

Next, processing operation of the smartphone 1 in case where it adjusts volume value is described based on flow chart illustrated in FIG. 10. When the controller 2 detects contact to the knob 22 and movement of contact, it judges whether the target 23 that is a movement goal position of the knob 22 is less than the lower limit of the limit area or not, namely, the target 23 is within the normal area or not (S1). In case that the controller 2 judges that the target 23 is less than the lower limit of the limit area, namely, the target 23 is within the normal area (S1: Yes), it moves the knob 22 to the target 23 with movement speed of the target 23 that it receives movement (S2). Next, the controller 2 sends volume value corresponding to the position of the knob 22 to the AV receiver 11 (S3).

In case that the controller 2 judges that the target 23 is not less than the lower limit of the limit area, namely, the target is out of the normal area (S1: No), it moves the knob 22 to the lower limit of the limit area with movement speed of the target 23 that it receives movement (S4). Next, the controller 2 sends volume value corresponding to the position of the knob 22 to the AV receiver 11 (S5). Next, the controller 2 moves the knob 22 and the lower limit of the limit area toward direction of the upper limit (maximum of volume value) of the limit area with the predetermined speed (S6). In other words, the controller 2 moves the knob 22 and the lower limit of the limit area toward direction of the upper limit of the limit area with the same predetermined speed as expansion speed of the limit area while it expands the normal area toward the limit area side with the predetermined speed. Next, the controller 2 judges whether it detects contact to the target 23 or not (S7). In other words, the controller 2 judges whether the finger is released from the target 23 or not.

In case that the controller 2 judges that it detects contact to the target 23 (S7: No), it judges whether it moves the knob 22 to the target 23 or not (S8). In case that the controller 2 judges that it does not move the knob 22 to the target 23 (S8: No), it returns to processing of S1. In case that the controller 2 judges that it moves the knob 22 to the target 23 (S8: Yes), it judges whether it expands the normal area toward the limit area side to the predetermined area 24 or not (S9). In case that the controller 2 judges that it does not expand the normal area toward the limit area side to the predetermined area 24 (S9: No), it moves lower limit of the limit area toward direction of the upper limit of the limit area with the predetermined area 24 (S10). In other words, the controller 2 expands the normal area toward the limit area side with the predetermined speed.

In case that the controller 2 judges that it expands the normal area toward the limit area side to the predetermined area 24 (S9: Yes), it ends processing. Further, the controller 2 judges that it does not detect contact to the target 23 (S7: Yes), it executes processing of S9. Namely, the controller 2 stops movement of the knob 22 and the lower limit of the limit area. Further, the controller 2 executes processing of S9 after processing of S3.

Figure 11:
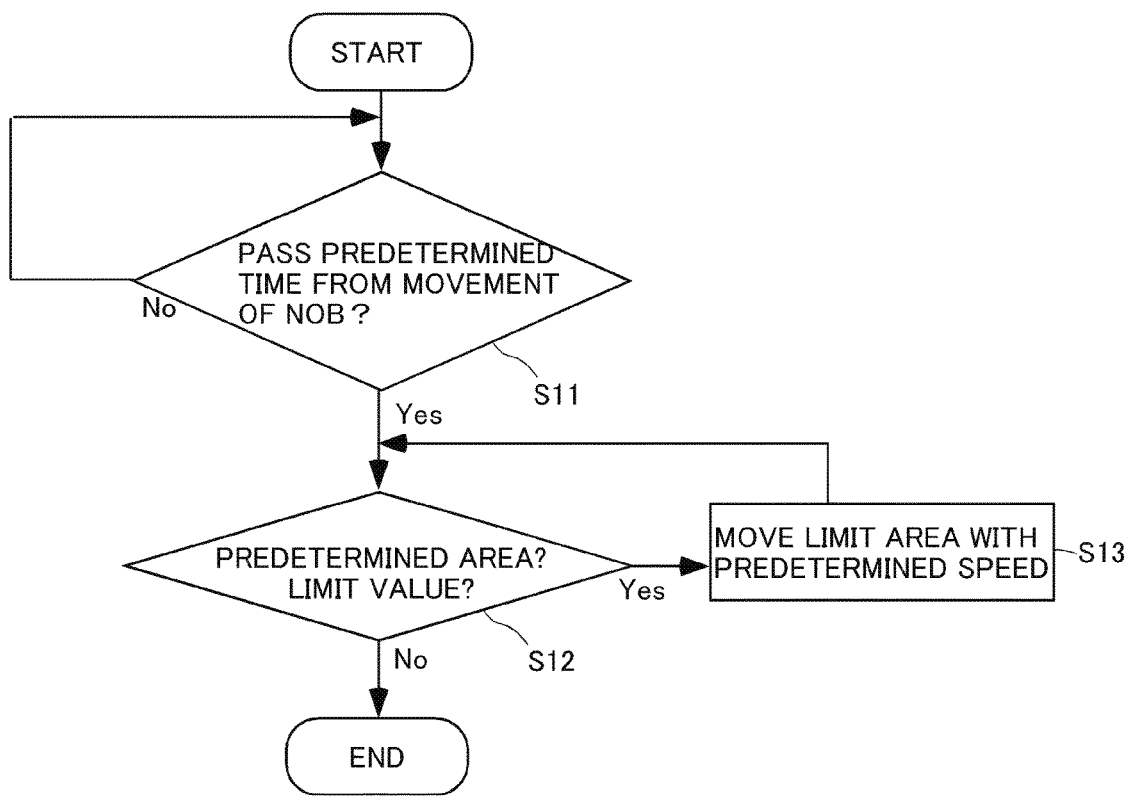
FIG. 11 is a flow chart illustrating processing operation of the smartphone when idling.
Figure 12:
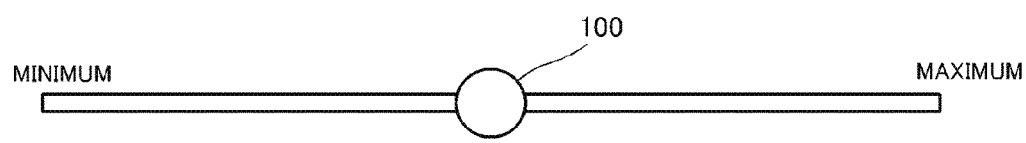
FIG. 12 is a diagram illustrating a conventional slide bar.
Figure 13:
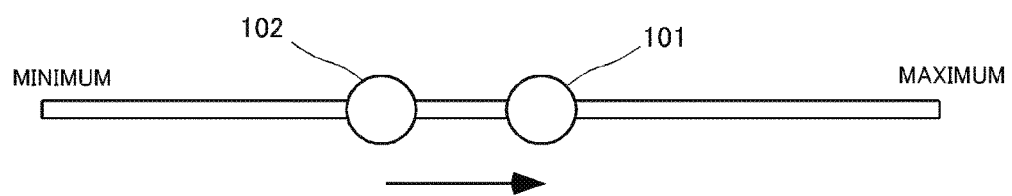
FIG. 13 is a diagram illustrating the conventional slide bar.

Next, processing operation of the smartphone 1 when it idles is described based on flow chart illustrated in FIG. 11. The controller 2 judges whether the predetermined time passes after movement complete of the knob 22 or not (S11). While the controller 2 judges that the predetermined time does not pass (S11: No), it executes processing of S11 repeatedly. In case that the controller 2 judges that the predetermined time passes (S11: Yes), it judges whether distance between the position of the knob 22 and the lower limit of limit area is not less than distance corresponding to the predetermined area 24 or not, or, the lower limit of the limit area is not less than limit value or not (S12). In case that the controller 2 judges that distance between the position of the knob 22 and the lower limit of limit area is not less than distance corresponding to the predetermined are, or, the lower limit of the limit area is not less than the limit value (S12: Yes), it expands the limit area toward the normal area side with the predetermined speed (S13). Meanwhile, in case that the controller 2 judges that distance between the position of the knob 22 and the lower limit of limit area is less than distance corresponding to the predetermined area 24, or, the lower limit of the limit area is less than the limit value (S12: No), it ends processing.

As described in the above, in the present embodiment, in case that the controller 2 receives movement of the target 23 to the limit area over the normal area, it moves the knob 22 with movement speed of the target 23 that it receives movement within the normal area. Thus, the user can change volume quickly within the normal area. Further, the controller 2 moves the knob 22 and the lower limit of the limit area from the lower limit of the limit area to the target 23 that is the movement goal position of the knob 22 with the same predetermined speed as expansion speed of the limit area while it expands the normal area toward the limit area side with the predetermined speed. Thus, that loud audio that the user does not intend occurs is prevented.

Further, in the present embodiment, the controller 2 moves the knob 22 from the lower limit of the limit area to the target 23 with the predetermined speed that is slower than movement speed of the target 23 that it receives movement. Thus, that loud audio that the user does not intend occurs is prevented because change of volume value becomes slow.

Further, in the present embodiment, after the controller 2 moves the knob 22 to the target 23, it moves the normal area toward the limit area side to the predetermined area 24. Thus, the user can move the knob 22 toward the limit area side to the predetermined area 24 quickly.

Further, in the present embodiment, in case that the controller 2 receives movement of the target 23 into the limit area over the normal area and if it continues detecting contact of the target 23, it moves the knob 22 and the lower limit of the limit area with the predetermined speed to the target 23 while it expands the normal area toward the limit area side with the predetermined speed. Thus, after the user moves the target 23 to the limit area, it touches the touch panel 9 until the knob 22 arrives at the target 23, it can move the knob 22 to the target 23 and direct desired volume value.

Further, in the present embodiment, in case that the controller 2 receives movement of the target 23 to the limit area over the normal area, when it does not detect contact to the target 23 before it moves the knob 22 to the target 23, it stops expansion of the normal area and movement of the knob 22. Thus, in case that the user directs loud volume value unintentionally, the volume value can be suppressed by releasing a finger from the touch panel 9.

In the present embodiment, in case that distance between the position of the knob 22 within the normal area and the lower limit of the limit area is not less than distance corresponding to the predetermined area 24 after the predetermined time passes after movement of the knob 22, the controller 2 expands the limit area toward the normal area. Thus, that loud audio that the user does not intend occurs with not less than current volume is prevented.

Further, in the present embodiment, the controller 2 expands the limit area toward the normal area side so that distance between the position of the knob 22 and the lower limit of the limit area can be distance corresponding to the predetermined area 24. The user can move the knob 22 toward the limit area side to the predetermined area 24 from current volume quickly.

Further, in the present embodiment, the controller 2 receives setting of limit value of the lower limit of the limit area, and it does not drop the lower limit of the limit area less than limit value that it receives. Thus, the user can move the knob 22 quickly within the region that is less than limit value.

Further, in the present embodiment, the controller 2 adjusts volume of the audio signal that is output from the AV receiver 11 by sending volume value corresponding to position of the moved knob 22 to the AV receiver 11. Thus, the user can direct volume value of the audio signal that is output from the AV receiver 11 by the smartphone 1.

The embodiment of the present invention is described above, but the mode to which the present invention is applicable is not limited to the above embodiment and can be suitably varied without departing from the scope of the present invention.

In the above mentioned embodiment, the controller 2 sends volume value corresponding to position of the moved knob 22 to the AV receiver 11. Not limited to this, the controller 2 may adjust volume of the audio signal that is output from the smartphone 1 to volume value corresponding to position of the moved knob 22.

In the above mentioned embodiment, a control program is installed in a smartphone, and case where an AV receiver is controlled by the smartphone. Not limited to this, the control program may be installed in a tablet PC, a feature phone, or a portable game machine.

In the above mentioned embodiment, the AV receiver is illustrated as an external device. Not limited to this, it may be a television, a CD player, or a Blu-ray (registered trademark) Disc player.

The present invention can be suitably employed in the volume adjustment device for adjusting volume of an audio signal.

What is claimed is:

1. A volume adjustment device comprising:
   a display section;
   a touch panel that is linked with the display section; and
   a controller, wherein
   the controller
   displays a slide bar on the display section, the slide bar including a normal area, a limit area, and a knob indicating a volume value, the normal area having a first end and a second end that corresponds to a lower limit of the limit area, the lower limit of the limit area corresponding to a higher volume value than the first end of the normal area, and the knob being movable between the first end of the normal area and the second end of the normal area,
   receives movement of contact detected on the touch panel, the detected contact indicating movement of a target that is a movement goal position of the knob,
   adjusts a volume of an audio signal to the volume value corresponding to a position of the knob,
   moves the knob with a moving speed of the target while the knob and the target are within the normal area, and does not move the knob above the lower limit into the limit area while the target is within the limit area, and
   moves the knob and the lower limit of the limit area from the lower limit of the limit area toward the target while the target is within the limit area, such that the second end of the normal area moves with the lower limit thereby expanding the normal area, the movement of the lower limit and the expansion of the normal area being at the same predetermined speed.

2. The volume adjustment device according to claim 1, wherein the predetermined speed is slower than a threshold movement speed of the target that the controller is capable of detecting.

3. The volume adjustment device according to claim 1, wherein the controller expands the normal area toward the limit area by a predetermined area after it moves the knob to the target.

4. The volume adjustment device according to claim 1, wherein the controller
   detects contact to the knob by the touch panel, and
   moves the knob with the predetermined speed to the target while it expands the normal area toward the limit area to the target with the predetermined speed when it receives movement of the target into the limit area over the normal area and if it continues detecting contact of the target.

5. The volume adjustment device according to claim 4, wherein the controller
   stops expansion of the normal area and movement of the knob when it does not detect contact to the target before it moves the knob to the target when the controller receives the movement of the target to the limit area over the normal area.

6. The volume adjustment device according to claim 1, wherein the controller
   stops expansion of the normal area and moves the knob to the target within the normal area after it receives movement of the target to the limit area over the normal area when it receives movement of the target from the limit area to the normal area.

7. The volume adjustment device according to claim 6, wherein the controller
   expands the normal area toward the limit area by a predetermined area when a distance between a position of the knob within the normal area and lower limit of the stopped limit area is less than a distance corresponding to the predetermined area.

8. The volume adjustment device according to claim 1, wherein the controller expands the limit area toward normal area when a distance between a position of the knob within the normal area and the lower limit of the limit area is not less than a distance corresponding to a predetermined area after a predetermined time passes after movement of the knob.

9. The volume adjustment device according to claim 8, wherein the controller expands the limit area toward the normal area so that the distance between the position of the knob and the lower limit of the limit area can be the distance corresponding to the predetermined area.

10. The volume adjustment device according to claim 8, wherein the controller receives a setting of a limit value of the lower limit of the limit area, and does not drop the lower limit of the limit area less than the limit value that it receives.

11. The volume adjustment device according to claim 1, further comprising: a communication section that is for communicating with an external device,
    wherein the controller adjusts the volume of the audio signal, which is output from the external device by sending the volume value corresponding to position of the moved knob to the external device.

12. A non-transitory storage medium storing a volume adjustment program that instructs a controller of a computer including a display section, a touch panel that is linked with the display section, and the controller
    to display a slide bar on the display section, the slide bar including a normal area, a limit area, and a knob indicating volume value, the normal area having a first end and a second end that corresponds to a lower limit of the limit area, the lower limit of the limit area corresponding to a higher volume value than the first end of the normal area, and the knob being movable between the first end of the normal area and the second end of the normal area,
    to receive movement of contact detected on the touch panel, the detected contact indicating movement of a target that is a movement goal position of the knob,
    to adjust a volume of an audio signal to a volume value corresponding to a position of the knob,
    to move the knob with a moving speed of the target while the knob and the target are within the normal area, and does not move the knob above the lower limit into the limit area while the target is within the limit area, and
    to move the knob and the lower limit of the limit area from the lower limit of the limit area toward the target while the target is within the limit area, such that the second end of the normal area moves with the lower limit thereby expanding the normal area, the movement of the lower limit and the expansion of the normal area being at the same predetermined speed.

* * * * *